United States Patent
Hu et al.

(10) Patent No.: US 11,928,273 B2
(45) Date of Patent: Mar. 12, 2024

(54) ARRAY SUBSTRATE AND DISPLAY DEVICE

(71) Applicants: BOE Technology Group Co., Ltd., Beijing (CN); Wuhan BOE Optoelectronics Technology Co., Ltd., Hubei (CN)

(72) Inventors: Fang Hu, Beijing (CN); Ning Zhu, Beijing (CN); Yujie Gao, Beijing (CN); Peng Jiang, Beijing (CN)

(73) Assignees: Wuhan BOE Optoelectronics Technology Co., Ltd., Hubei (CN); BOE Technology Group Co., Ltd., Beijing (CN)

( * ) Notice: Subject to any disclaimer, the term of this patent is extended or adjusted under 35 U.S.C. 154(b) by 137 days.

(21) Appl. No.: 17/421,737

(22) PCT Filed: Jan. 5, 2021

(86) PCT No.: PCT/CN2021/070349
§ 371 (c)(1),
(2) Date: Jul. 9, 2021

(87) PCT Pub. No.: WO2021/169611
PCT Pub. Date: Sep. 2, 2021

(65) Prior Publication Data
US 2022/0342499 A1    Oct. 27, 2022

(30) Foreign Application Priority Data
Feb. 25, 2020    (CN) .......................... 202010115823.4

(51) Int. Cl.
*G06F 3/041* (2006.01)
*G06F 3/044* (2006.01)
*H01L 27/12* (2006.01)

(52) U.S. Cl.
CPC ........ *G06F 3/0412* (2013.01); *G06F 3/04166* (2019.05); *G06F 3/044* (2013.01); *H01L 27/124* (2013.01)

(58) Field of Classification Search
CPC .. G06F 3/0443; G06F 3/0412; G06F 3/04164; G06F 3/04166; G06F 3/044; G06F 3/0446; H01L 27/124; H10K 59/40
See application file for complete search history.

(56) References Cited

U.S. PATENT DOCUMENTS

2016/0041665 A1* 2/2016 Gwon ................... G06F 3/0412
                                                              345/174
2016/0266454 A1* 9/2016 Wang .................... G02F 1/1368
(Continued)

FOREIGN PATENT DOCUMENTS

CN    104699353 A    6/2015
CN    105094422 A    11/2015
(Continued)

OTHER PUBLICATIONS

Office Action dated Mar. 3, 2021 for Chinese Patent Application No. 202010115823.4 and English Translation.
(Continued)

*Primary Examiner* — Robin J Mishler
(74) *Attorney, Agent, or Firm* — Ling Wu; Stephen Yang; Ling and Yang Intellectual Property

(57) ABSTRACT

The present disclosure discloses an array substrate and a display device. The array substrate includes a touch substrate, the touch substrate includes a plurality of touch electrodes and a plurality of touch electrode wires disposed in an array, each touch electrode includes a plurality of touch sensors disposed in an array, common electrodes of all pixel cells of the array substrate are reused as the touch sensors, and the array substrate includes data wires for providing display data to the pixel cells; the array substrate includes a
(Continued)

base substrate and a thin film transistor which are stacked, the touch electrode wires and the data wires are provided on the same layer where a source and a drain of the thin film transistor are located, and the touch electrode wires are abreast provided on the two sides of each data wire.

11 Claims, 7 Drawing Sheets

(56) References Cited

U.S. PATENT DOCUMENTS

| | | |
|---|---|---|
| 2016/0291791 A1 | 10/2016 | Qian |
| 2017/0147123 A1 | 5/2017 | Wang et al. |
| 2017/0322650 A1 | 11/2017 | Liu et al. |
| 2018/0120992 A1 | 5/2018 | Lee |
| 2018/0120994 A1 | 5/2018 | Yoo et al. |
| 2018/0232086 A1 | 8/2018 | Zhang et al. |
| 2018/0348951 A1 | 12/2018 | Kurasawa et al. |
| 2019/0018516 A1* | 1/2019 | Kim .................. G06F 3/044 |
| 2019/0050100 A1 | 2/2019 | Ma et al. |
| 2019/0204972 A1 | 7/2019 | Shin et al. |
| 2019/0346711 A1 | 11/2019 | Yeh et al. |
| 2020/0073499 A1 | 3/2020 | Chi et al. |

FOREIGN PATENT DOCUMENTS

| | | |
|---|---|---|
| CN | 105094479 A | 11/2015 |
| CN | 105373272 A | 3/2016 |
| CN | 106775165 A | 5/2017 |
| CN | 106876330 A | 6/2017 |
| CN | 107153289 A | 9/2017 |
| CN | 108020945 A | 5/2018 |
| CN | 108021268 A | 5/2018 |
| CN | 108628047 A | 10/2018 |
| CN | 108874231 A | 11/2018 |
| CN | 109213379 A | 1/2019 |
| CN | 110018583 A | 7/2019 |
| CN | 110471551 A | 11/2019 |
| CN | 110673366 A | 1/2020 |
| CN | 111367431 A | 7/2020 |

OTHER PUBLICATIONS

Office Action dated Dec. 3, 2021 for Chinese Patent Application No. 202010115823.4 and English Translation.

International Search Report for PCT/CN2021/070349 dated Mar. 25, 2021.

* cited by examiner

ARRAY SUBSTRATE AND DISPLAY DEVICE

CROSS-REFERENCE TO RELATED APPLICATIONS

The present application is a U.S. National Phase Entry of International Application No. PCT/CN2021/070349 having an international filing date of Jan. 5, 2021, which claims the priority of Chinese patent application No. 202010115823.4 filed to CNIPA on Feb. 25, 2020, titled "Array Substrate and Display Device". The entire contents of the above-identified applications are hereby incorporated by reference.

TECHNICAL FIELD

The present disclosure generally relates to, but is not limited to, the field of display technology, in particular to an array substrate, a manufacturing method, and a display device.

BACKGROUND

With the development of intelligent technology, display screens (touch screen) with a touch function have been more and more widely used. Current mainstream touch screens are mainly classified into two types, i.e., On-Cell and In-Cell. For On-Cell, a touch layer is embedded between a color filter substrate and a polarizer. For In-Cell, a touch layer is embedded into pixel cells, and common electrodes on a TFT array substrate are used as touch sensors. Since In-Cell touch only needs a single touch layer, the transmittance of the touch screen is improved, the limitation of this technology to physical design is greatly reduced, the screen is lighter and thinner, it is suitable for the current trend of ultra-thinning, and thus its application scope is very wide. In-Cell touch technology needs to consider whether added touch sensors affect the original display effect of the display screen.

SUMMARY

The following is a brief description of the subject matter described in detail in the present disclosure. This brief description is not intended to limit the scope of protection of the claims.

The present disclosure provides an array substrate, the array substrate includes a touch substrate, the touch substrate includes a plurality of touch electrodes and a plurality of touch electrode wires disposed in an array, each touch electrode includes a plurality of touch sensors disposed in an array, common electrodes of pixel cells of the array substrate are reused as the touch sensors, and the array substrate includes a plurality of data wires for providing display data to the pixel cells; the array substrate includes a base substrate and a thin film transistor which are stacked, the touch electrode wires and the data wires are provided on the same layer where a source and a drain of the thin film transistor are located, and the touch electrode wires are abreast provided on the two sides of each data wire.

In an exemplary embodiment, in one of the touch electrodes, adjacent common electrodes disposed horizontally are electrically connected to form a common electrode strip; in one of the touch electrodes, the common electrode strip is electrically connected through at least one touch electrode wire, the at least one touch electrode wire is electrically connected to a touch driver such that each common electrode strip is capable of receiving a signal transmitted by the touch driver, and the touch driver provides common voltage or a touch drive signal to the touch electrode.

In an exemplary embodiment, in one of the touch electrodes, the common electrode strip is electrically connected through one touch electrode wire, and the one touch electrode wire is respectively electrically connected to the common electrodes adjacent to the touch electrode wire in the common electrode strip through a via.

In an exemplary embodiment, in one of the touch electrodes, the common electrode strip is electrically connected through two touch electrode wires, one touch electrode wire is electrically connected to the common electrodes in even rows adjacent to the touch electrode wire through a via, and the other touch electrode wire is electrically connected to the common electrodes in odd rows adjacent to the touch electrode wire through a via.

In an exemplary embodiment, the two touch electrode wires are provided on the two sides of the same data wire, and before the two touch electrode wires are connected to the touch driver, the two touch electrode wires are connected to form a lead wire which is connected to the touch driver.

In an exemplary embodiment, the touch electrode wires and the data wires are made of the same metal material as the source and the drain.

In an exemplary embodiment, the width of the data wires is greater than the width of the touch electrode wires.

The present disclosure further provides a display device, including: the array substrate; and a color film substrate including color-resistant sheets disposed in an array and black matrixes located between adjacent two color-resistant sheets.

In an exemplary embodiment, an orthographic projection of the black matrixes on the base substrate covers an orthographic projection of the data wires and the touch electrode wires on the two sides of the data wires on the base substrate.

In an exemplary embodiment, an orthographic projection of the black matrixes on the base substrate covers an orthographic projection of the data wires and gaps on two sides of the data wires on the base substrate, and the gaps are located between the data wires and the touch electrode wires adjacent to the data wires.

In an exemplary embodiment, the touch driver includes a first touch driver and a second touch driver located at two opposite ends of the array substrate, and two ends of the same touch electrode wire are respectively electrically connected to the first touch driver and the second touch driver.

After reading and understanding the drawings and the detailed description, other aspects can be understood.

BRIEF DESCRIPTION OF DRAWINGS

Other characteristics, objectives, and advantages of the present disclosure will become more apparent by reading the detailed description of the non-restrictive embodiments with reference to the following drawings.

DETAILED DESCRIPTION

Figure 1:
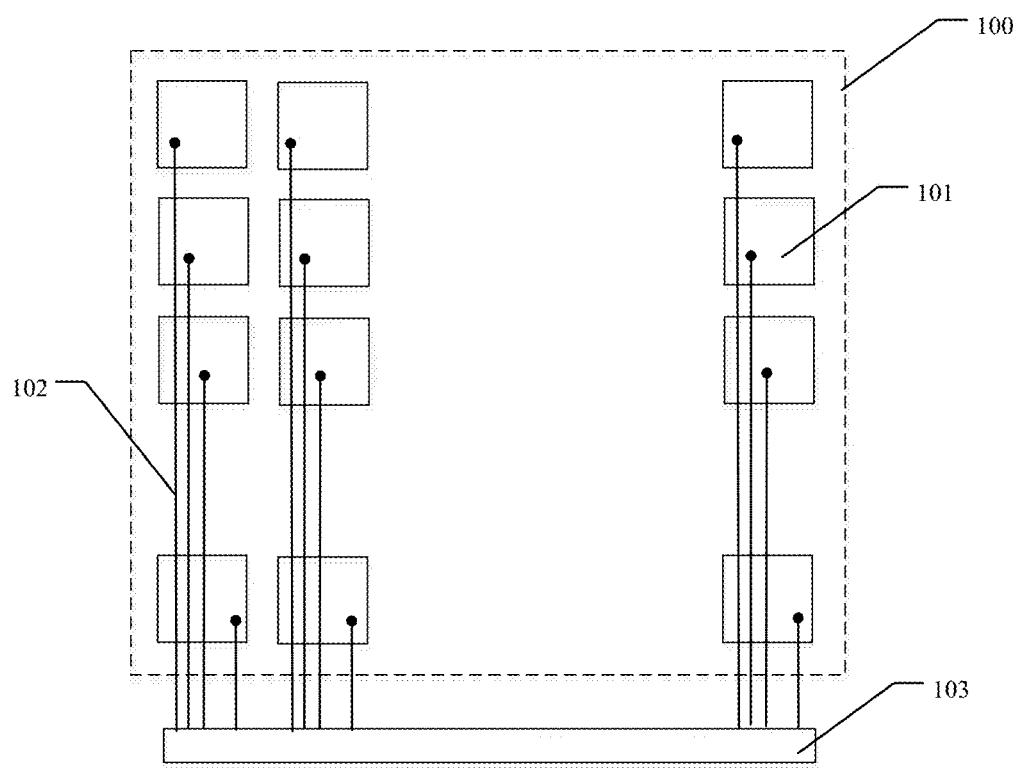
FIG. 1 illustrates an exemplary structural schematic diagram of an In-Cell touch substrate according to an embodiment of the present disclosure.

The present disclosure will be further described below in detail in combination with the embodiments and with reference to the drawings. It can be understood that the specific embodiments described herein are only used to explain the present disclosure, not to limit the present disclosure. For the convenience in description, only those parts related to the present disclosure are illustrated in the drawings.

Unless otherwise defined, technical terms or scientific terms used in the present disclosure should have the common meaning understood by those skilled in the art of the present disclosure. Terms "first", "second" and the like used in the present disclosure do not mean any order, quantity or importance, but are only used to distinguish different components. Terms "include", "comprise" or the like means that the element or object appearing before the terms covers the elements or objects listed after the terms and there equivalents without excluding other elements or objects. Terms "connect", "connecting" or the like is not limited to physical or mechanical connection, but may include electrical connection, whether direct or indirect. "Up", "down", "left", "right" and so on are only used to represent the relative position relationship. After the absolute position of the described object changes, the relative position relationship may change accordingly.

Without conflict, the embodiments in the present disclosure and the features in the embodiments may be combined with each other. The present disclosure will be described below in detail with reference to the drawings and in combination with the embodiments.

Referring to FIG. 1, a touch substrate includes a plurality of touch electrodes 101 disposed in an array and touch electrode wires 102 respectively connected to the touch electrodes. Through the touch electrode wire 102, each touch electrode 101 is connected to a touch driver 103 to determine a touch position. As shown in FIG. 1, there is at least one touch electrode wire 102 passing through each touch electrode 101, and any one or two of the touch electrode wires 102 may be selected to connect the touch electrode 101 to the touch driver 103. The touch substrate of the present disclosure is located on an array substrate and belongs to an In-Cell mode. Each touch electrode includes a plurality of touch sensors disposed in an array. Common electrodes of all pixel cells of the array substrate are reused as the touch sensors. All common electrodes belonging to the same touch electrode are connected to each other. Therefore, it can be understood that the common electrodes of the array substrates are not a whole block, but the common electrodes need to be made into independent blocks corresponding to the pixel cells, and the corresponding number of common electrodes need to be connected together to respectively form a plurality of touch electrodes.

In a touch sensing cycle, the touch driver 103 supplies a touch drive signal to the touch electrodes 101, and determines which touch electrode is touched based on a sensing signal received by the touch electrode. In a display cycle for displaying an image, the touch driver supplies common voltage to the touch electrodes. In an exemplary embodiment, the number of the common electrodes in each touch electrode is not limited and is set according to a specific scenario.

Figure 2:
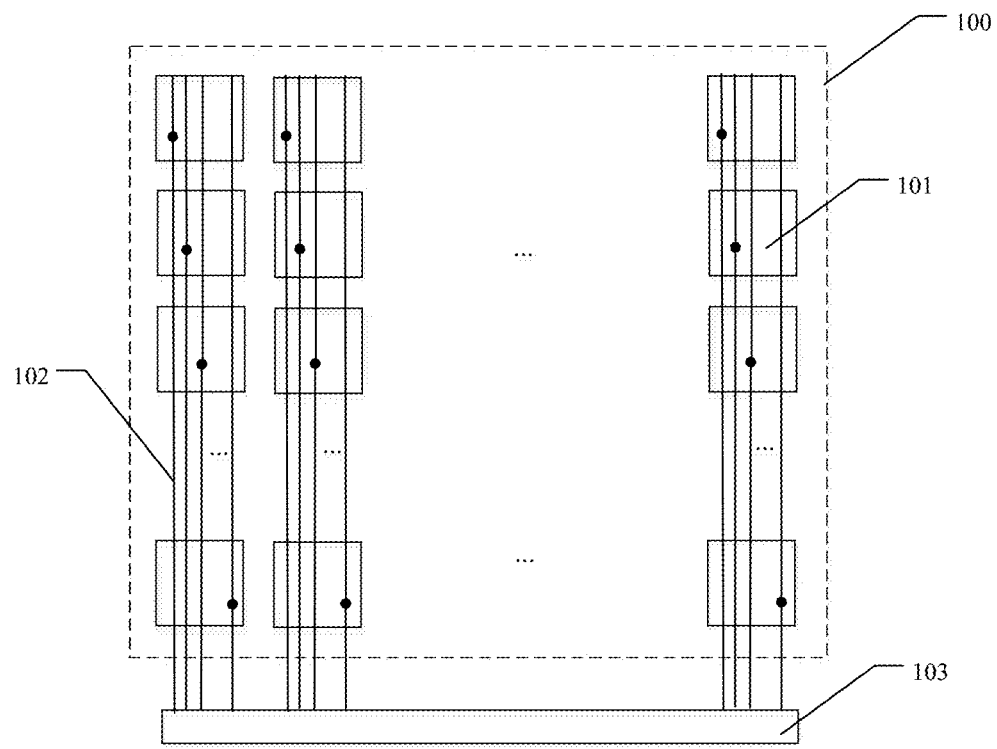
FIG. 2 illustrates an exemplary structural schematic diagram of an In-Cell touch substrate according to another embodiment of the present disclosure.

As another exemplary embodiment, referring to FIG. 2, the touch electrode wires may extend from an upper end of a display region 100 to a lower end. At this time, the capacitance formed between the touch electrode wires and the data wires is uniform, and the accuracy of touch sensing is improved.

Figure 3:
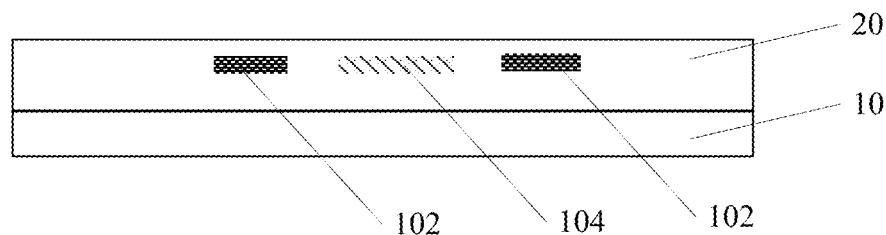
FIG. 3 illustrates an exemplary structural schematic diagram of an array substrate according to an embodiment of the present disclosure.

Please refer to FIG. 3. In the present disclosure, the array substrate includes a base substrate 10 and a thin film transistor 20 which are stacked. The touch electrode wires 102 are disposed in the display region of the array substrate, are disposed on the same layer as the data wires 104 at a layer where the source and the drain of the thin film transistor are located, and are abreast disposed on the two sides adjacent to the data wires 104, as illustrated in FIG. 3.

The present disclosure provides an array substrate with an In-Cell touch structure that does not affect the display quality by disposing the touch electrode wires and the data wires on the same layer where the source and the drain of the thin film transistor are located, and abreast disposing the touch electrode wires on the two sides of each data wire. In addition, by disposing the touch electrode wires and data wires on the same layer, the thickness of the touch electrode wires can be increased as much as possible and the impedance is reduced, which is conducive to the transmission of the touch signal.

Figure 4:
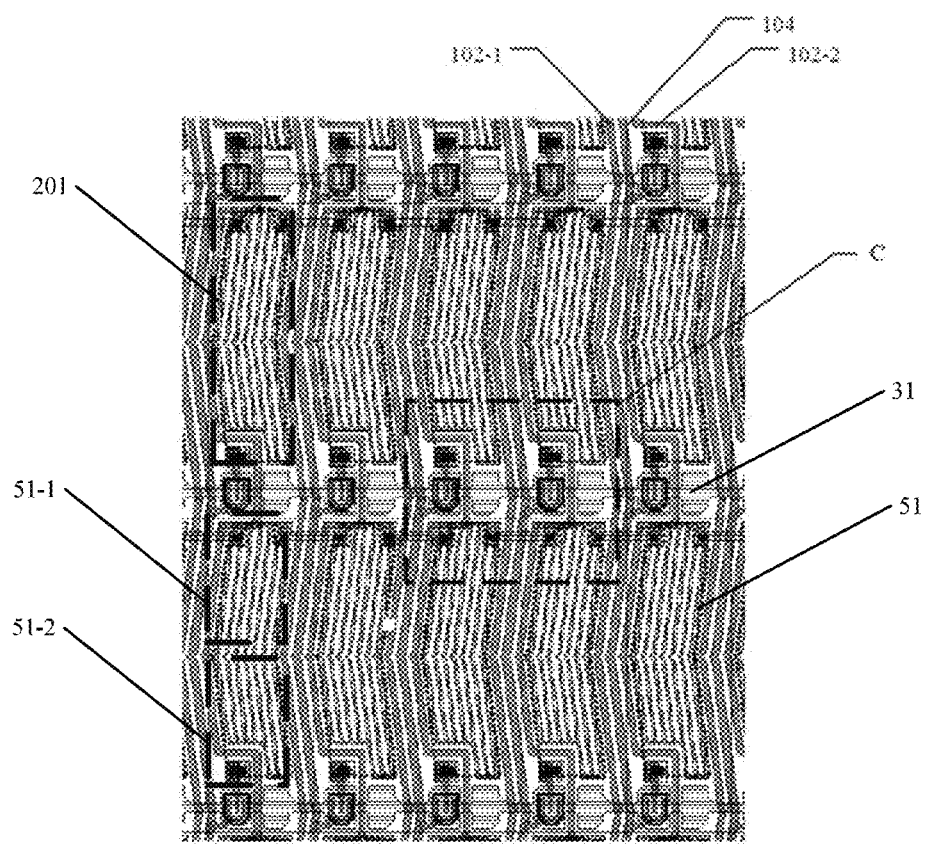
FIG. 4 illustrates an exemplary structural schematic diagram of an HADS mode array substrate according to an embodiment of the present disclosure.

Please refer to FIG. 4 to FIG. 7, which respectively illustrate a schematic diagram, an enlarged view, an A-A sectional view and B-B sectional view of an array substrate of an HADS (High Transmittance Advanced Super Dimension Switch) structure mode. Referring to FIG. 4, the common electrodes of the array substrate adopt a dual domain structure, including scan lines 31 and data wires 104. The scan lines 31 and the data wires 104 are cross insulated and define pixel cells 201. Each pixel cell 201 is provided with a common electrode 51 with a dual domain structure, that is, one common electrode 51 includes two domain parts, a first domain part 51-1 and a second domain part 51-2, respectively. The array substrate further includes pixel electrodes. The common electrodes in this embodiment are slit electrodes. There are a plurality slits inside. The pixel electrodes are planar electrodes.

Figure 5:
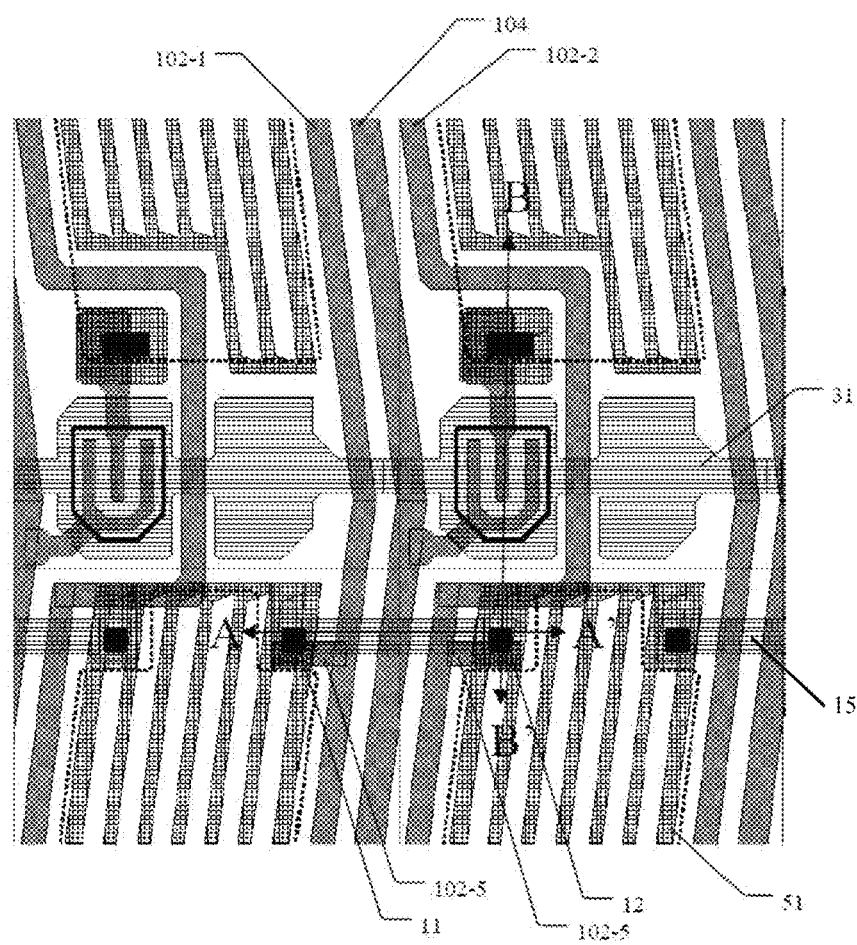
FIG. 5 illustrates a local enlarged view of zone C in FIG. 4.
Figure 6:
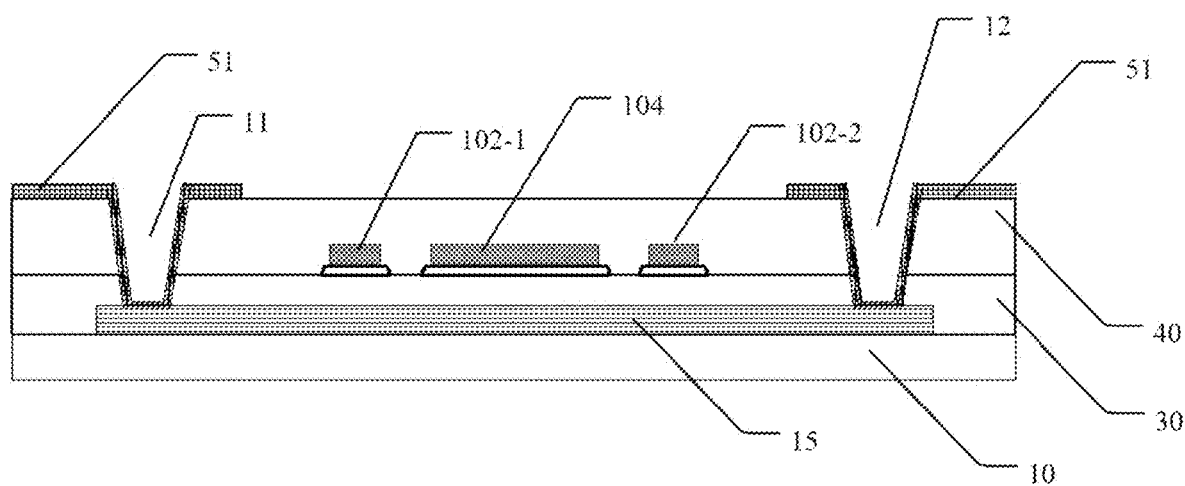
FIG. 6 illustrates an A-A' sectional view of FIG. 5.
Figure 7:
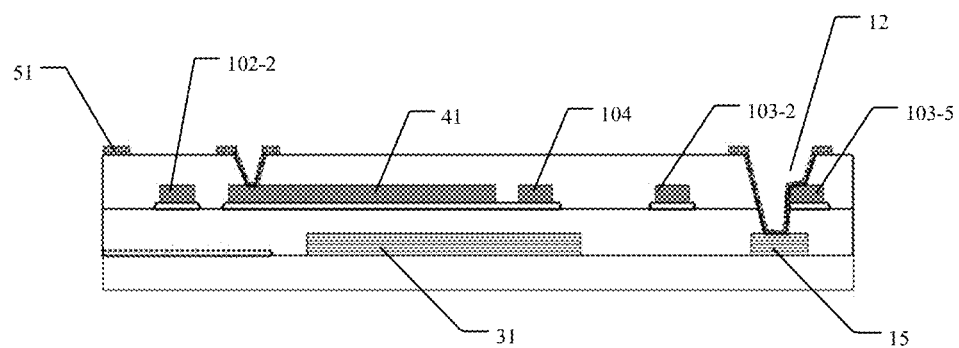
FIG. 7 illustrates a B-B' sectional view of FIG. 5.

Referring to FIG. 5, FIG. 6 and FIG. 7, the array substrate includes a base substrate 10, a gate insulating layer 30, a passivation layer 40 and common electrodes 51 which are sequentially stacked. The common electrodes 51 of adjacent pixel cells are horizontally and electrically connected through connecting wires 15 and a via 11 and a via 12 in the gate insulating layer 30 to form a common electrode strip. In one touch electrode, the common electrodes of each pixel cell in the same row are horizontally connected through the connecting wires 15. The connecting wires 15 are disposed on the same layer as the scan lines 31. The connecting wires 15 are connected to the corresponding common electrodes 51 through the via 11 and the via 12. In order to increase the thickness of the connecting wires 15, the connecting wires 15 are not disposed at the layer where the pixel electrodes 51 are located, but are disposed at the same layer as the scan lines 31. In this way, the resistance of the connecting wires 15 is reduced. Therefore, the connection between the horizontally disposed common electrodes belonging to the touch electrode is realized. In an exemplary embodiment, the connecting wires are disposed between the common electrodes of each pixel cell of the entire array substrate. The disconnection between the touch electrodes is realized by not disposing a via 11 and a via 12 between the connecting wires at the disconnection points of the touch electrodes and the common electrodes, such that the connecting wires at the disconnection points of the touch electrodes are disconnected from adjacent common electrodes. In addition, the size of each touch electrode is generally about 4 mm$^2$, which corresponds to a plurality of pixel cells. The specific size of the touch electrode may be set according to the application scenario, which is not limited here. The shape of the touch electrodes is not limited to a quadrangular shape, and may also be a polygonal shape such as a triangular shape or a hexagonal shape, which is not limited here.

In some exemplary embodiments, the longitudinal connection of the common electrode strips is realized through a touch electrode wire. In an exemplary embodiment, a leading-out wire 102-5 of the touch electrode wire 102-2 in FIG. 4 connects each common electrode adjacent to the touch electrode wire 102-2 to the touch electrode wire 102-2 through the via 12, realizing the longitudinal connection between all common electrode strips in the corresponding touch electrode.

Similarly, a leading-out wire 102-5 of the touch electrode wire 102-1 can connect each common electrode adjacent to the touch electrode wire 102-1 to the touch electrode wire through the via 11. At this time, any one of the touch electrode wire 102-1 or the touch electrode wire 102-2 may be selected for the connection between the touch electrode and the touch driver.

Figure 8:
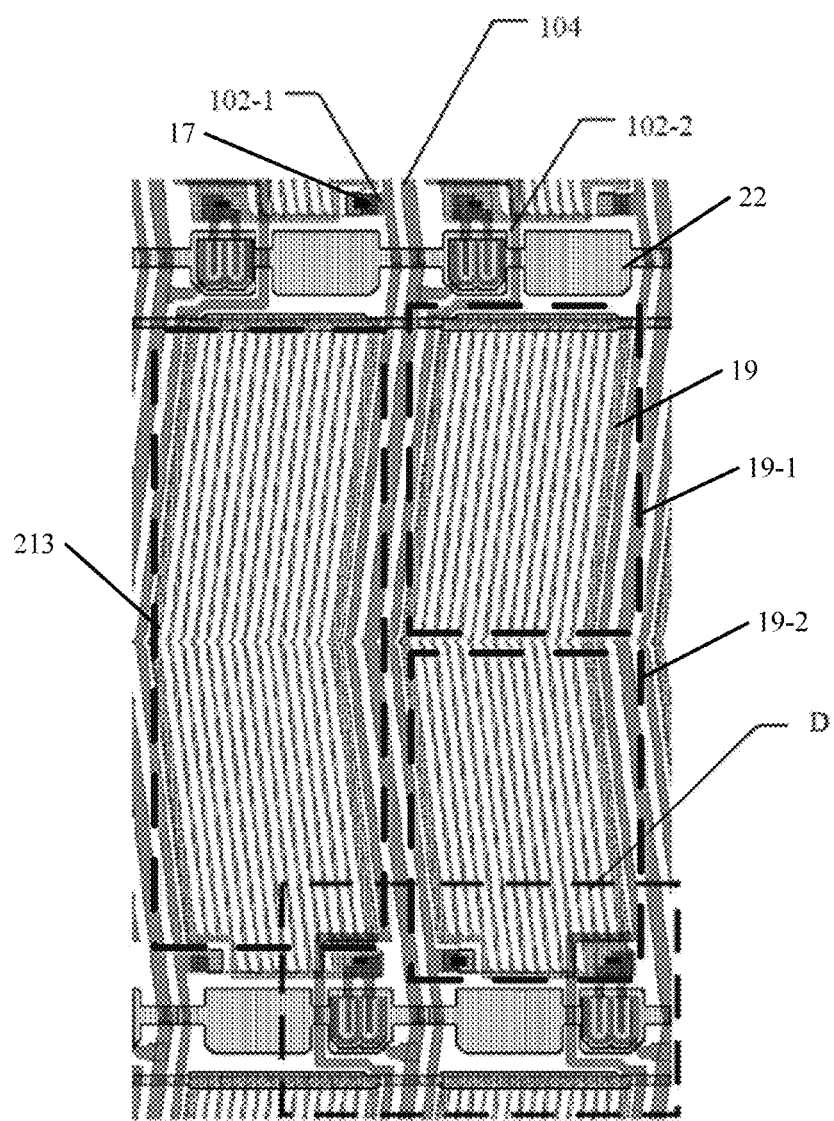
FIG. 8 illustrates an exemplary structural schematic diagram of an ADS mode array substrate according to an embodiment of the present disclosure.
Figure 9:
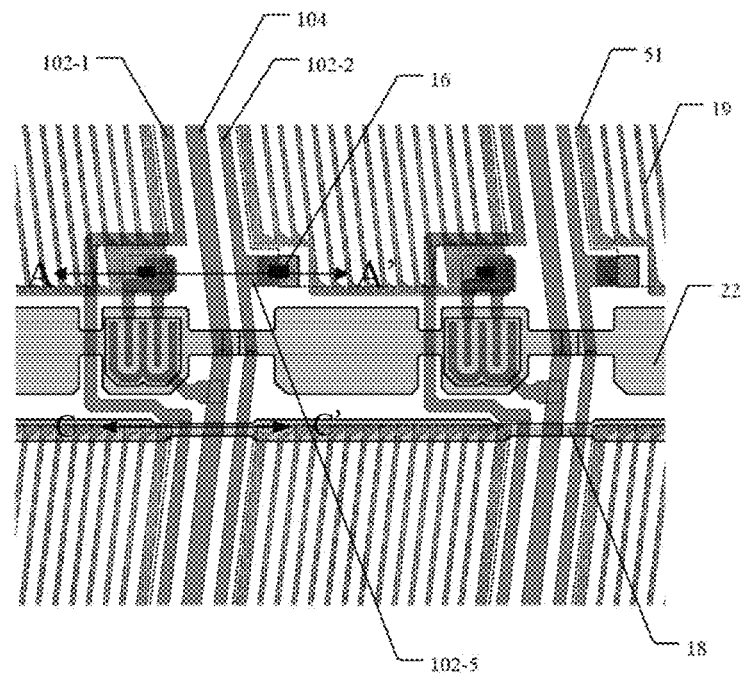
FIG. 9 illustrates a local enlarged view of zone D in FIG. 8.
Figure 10:
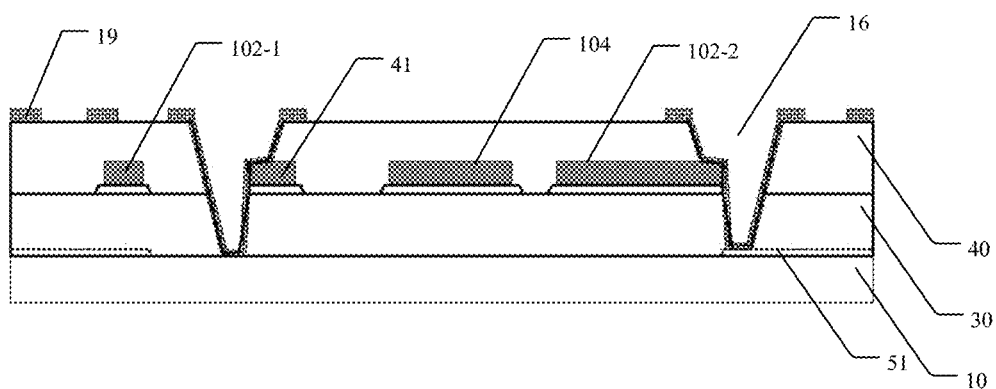
FIG. 10 illustrates an A-A' sectional view of FIG. 9.

Please refer to FIG. 8 to FIG. 10, which respectively illustrate a schematic diagram, an enlarged view and an A-A sectional view of an array substrate of an ADS (Advanced Super Dimension Switch) structure mode. Referring to FIG. 8, the pixel electrodes of the array substrate adopt a dual domain structure, including scan lines 22 and data wires 104. The scan lines 22 and the data wires 104 are cross insulated and define pixel cell 210. Each pixel cell 210 is provided with pixel electrodes 19. The pixel electrodes 19 have a dual domain structure, that is, one pixel electrode 19 includes two domain parts, a first domain part 19-1 and a second domain part 19-2, respectively. The array substrate further includes common electrodes 51. The pixel electrodes 19 in this embodiment are slit electrodes. There are a plurality of slits inside. The common electrodes are planar electrodes.

Figure 11:
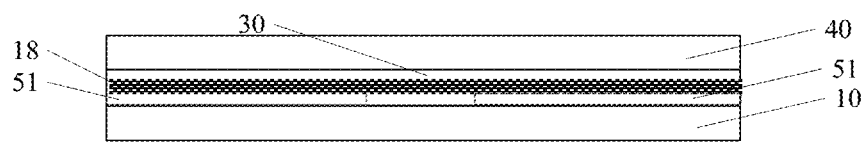
FIG. 11 illustrates a C-C' sectional view of FIG. 9.

The array substrate includes a base substrate 10, a gate insulating layer 30, a passivation layer 40 and pixel electrodes 19 which are sequentially disposed. Common electrodes 51 are disposed between the base substrate 10 and the gate insulating layer 30. Referring to FIG. 11, in one touch electrode, the common electrodes 51 of each pixel cell are horizontally and electrically connected by overlapping the connecting wires 18 above the common electrodes 51 to form a common electrode strip. At this time, the material of the connecting wires 18 is the same as that of a gate. In this way, the connection between the horizontally disposed common electrodes belonging to the touch electrode is realized. In an exemplary embodiment, in pixel cells in the same row of one touch electrode, the connecting wire 18 extends from a first pixel cell to a last pixel cell, and is only disconnected at the disconnection points between the touch electrodes. Therefore, the disconnection between the touch electrodes is realized. In addition, the size of each touch electrode is generally about 4 mm$^2$, which corresponds to a plurality of pixel cells. The size of the touch electrode may be set according to the application scenario, which is not limited here. The shape of the touch electrodes is not limited to a quadrangular shape, and may also be a polygonal shape such as a triangular shape or a hexagonal shape, which is not limited here.

Figure 12:
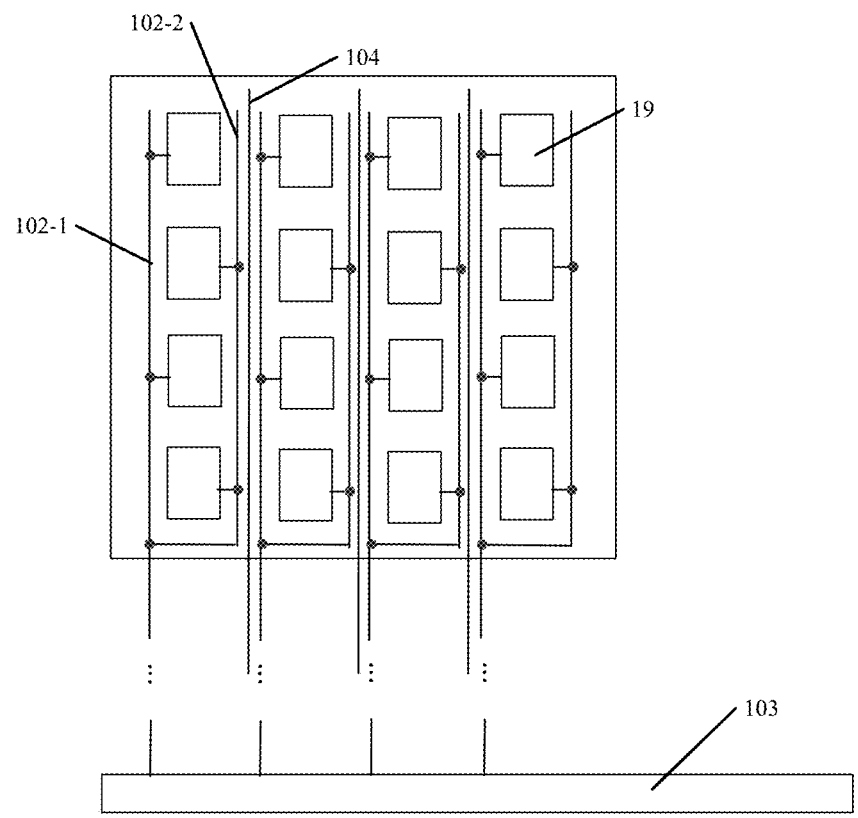
FIG. 12 illustrates a schematic diagram of connection between a touch electrode and a touch driver of an ADS mode array substrate according to an embodiment of the present disclosure.

In some embodiments, the longitudinal connection of the common electrode strips is realized through two touch electrode wires. In an exemplary embodiment, a leading-out wire 102-5 of the touch electrode wire 102-2 in FIG. 10 connects the common electrodes in even rows adjacent to the touch electrode wire 102-2 through a via 16, realizing the longitudinal connection between the common electrodes in even rows in the corresponding touch electrode. Similarly, a leading-out wire 102-5 of the touch electrode wire 102-1 can connect the common electrodes in odd rows adjacent to the touch electrode wire 102-1 to the touch electrode wire through a via 17. As shown in FIG. 12, in some exemplary embodiments, the touch electrode wire 102-1 and the touch electrode wire 102-2 respectively connecting the common electrodes 19 in odd rows and even rows are disposed on the two sides of the same data wire 104. Before connected to the touch driver 103, the two touch electrode wires are connected to form a lead wire which is connected to the touch driver 103. Thus, before connected to the touch driver, the touch electrode wire 102-2 and the touch electrode wire 102-1 are connected together to realize the longitudinal connection of each common electrode strip.

In an exemplary embodiment, for the convenience in connection, two touch electrode wires are disposed on the two sides of the same data wire, and respectively connect the common electrodes in odd and even rows. In addition, the number of touch wires may be increased to meet the demand for a large number of touch electrodes for large-size touch.

In addition, in order to avoid increasing the number of masks, the touch electrode wires and the data wires are made of the same metal material as the source and the drain. In this way, when the mask process is used to make the source and the drain, the required touch electrode wires and data wires are patterned at the same time. Therefore, the formation of the touch substrate is realized without increasing the masks.

In some embodiments, the width of the data wires is greater than the width of the touch electrode wires. The large width of the data wires is to reduce the resistance, so as to reduce the delay in the process of data signal transmission, while the requirement of the touch electrode wires on signal transmission is not high.

The present disclosure further provides a display device, which includes the array substrate provided by the embodiments of the present disclosure.

Figure 13:
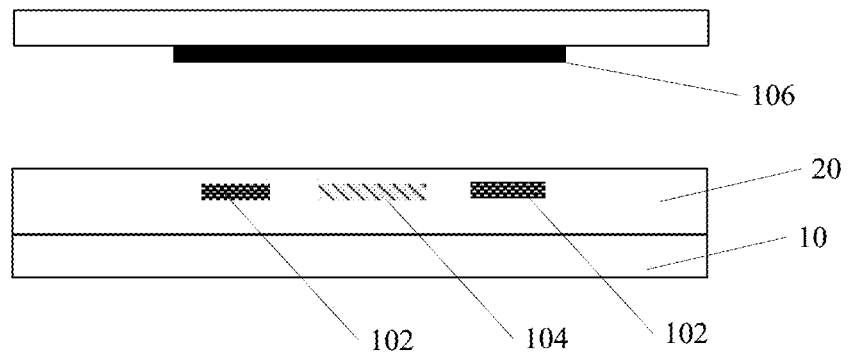
FIG. 13 illustrates an exemplary structural schematic diagram of a display device with an In-Cell touch structure according to an embodiment of the present disclosure.
Figure 14:
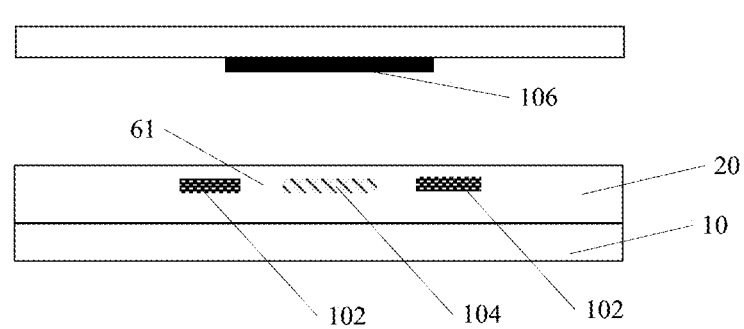
FIG. 14 illustrates an exemplary structural schematic diagram of a display device with an In-Cell touch structure according to another embodiment of the present disclosure.

In some exemplary embodiments, the display device further includes a color film substrate, which includes color-resistant sheets disposed in an array and black matrixes 106 located between adjacent two color-resistant sheets. When the array substrate adopts an ADS structure mode, an orthographic projection of the black matrixes 106 on the base substrate 10 covers an orthographic projection of the data wires 104 and the touch electrode wires 102 on the two sides of the data wires 104 on the base substrate 10, as illustrated in FIG. 13. When the array substrate adopts an HADS structure mode, an orthographic projection of the black matrixes 106 on the base substrate 10 covers an orthographic projection of the data wires 104 and gaps 61 on two sides of the data wires 104 on the base substrate, and the gaps 61 are located between the data wires 104 and the touch electrode wires 102 adjacent to the data wires 104, as illustrated in FIG. 14.

Figure 15:
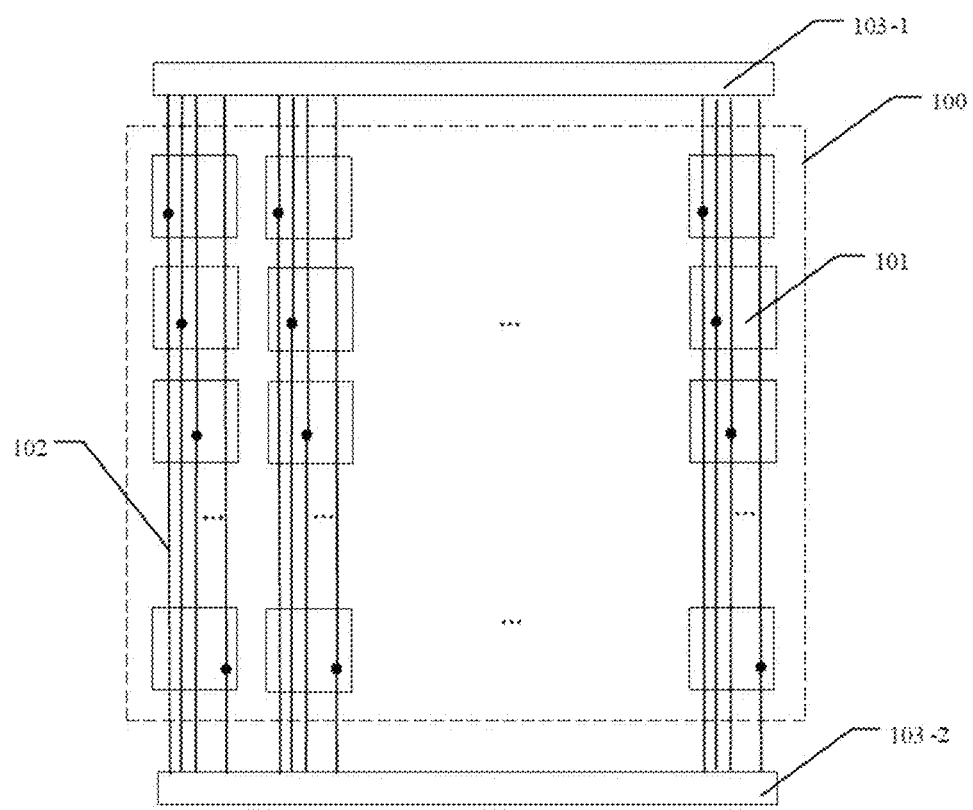
FIG. 15 illustrates an exemplary structural schematic diagram of a display device with an In-Cell touch structure according to another embodiment of the present disclosure.

In some exemplary embodiments, the display device further includes a touch driver, for example, a first touch driver 103-1 and a second touch driver 103-2 respectively disposed at two opposite ends of the array substrate. Two ends of the same touch electrode are respectively electrically connected to the first touch driver and the second touch driver. When the touch substrate is applied to a large-area display device, in order to reduce the delay caused by the resistance of the wires, such that each touch electrode can receive a uniform touch drive signal, touch drivers are respectively disposed at two ends of the touch electrode wires, and a touch drive signal is provided to the touch electrodes through the same touch drive signal at the two ends, as illustrated in FIG. 15.

To sum up, according to the technical solution provided by the embodiment of the present disclosure, by disposing the touch electrode wires and data wires on the same layer where the source and the drain of the thin film transistor are located, and abreast disposing the touch electrode wires on the two sides of each data wire, an array substrate with an In-Cell touch structure that does not affect the display quality is provided.

The above description is only the description of the exemplary embodiments of the present disclosure and the technical principles used thereof. Those skilled in the art should understand that the invention scope involved in the present disclosure is not limited to the technical solutions formed by the specific combination of the above technical features, but covers other technical solutions formed by any combination of the above technical features or their equivalent features without departing from the invention concept, for example, the technical solutions formed by replacing the above features with (but not limited to) the technical features having similar functions disclosed in the present disclosure.

What is claimed is:

1. An array substrate, wherein:
    the array substrate comprises a touch substrate, the touch substrate comprises a plurality of touch electrodes and a plurality of touch electrode wires disposed in an array, each touch electrode comprises a plurality of touch sensors disposed in an array, common electrodes of pixel cells of the array substrate are reused as the touch sensors, each pixel cell comprises a common electrode, and each common electrode is reused as one of the plurality of touch sensors, in at least one touch electrode of the plurality of touch electrodes, the common electrodes of each pixel cell in a same row are horizontally connected through connecting wires, wherein the connecting wires are not scan lines, and are disposed at a same layer as the scan lines; and the array substrate comprises a plurality of data wires for providing display data to the pixel cells;
    the array substrate comprises a base substrate and a thin film transistor which are stacked, the touch electrode wires and the data wires are provided on the same layer where a source and a drain of the thin film transistor are located, and the touch electrode wires are abreast provided on two sides of each data wire;
    each common electrode has a dual domain structure including two domain parts: a first domain part and a second domain part respectively;
    each pixel electrode has a dual domain structure including two domain parts: a first domain part and a second domain part respectively; and
    in pixel cells in a same row of one touch electrode, the connecting wire is extended from a first pixel cell to a last pixel cell, and the connecting wire is disconnected at disconnection points between the touch electrodes by not disposing a first via and a second via between the connecting wires at the disconnection points of the touch electrodes and the common electrodes, and the connecting wires at the disconnection points of the touch electrodes are disconnected from adjacent common electrodes.

2. The array substrate according to claim 1, wherein in one of the touch electrodes, adjacent common electrodes disposed horizontally are electrically connected to form a common electrode strip;
    in one of the touch electrodes, the common electrode strip is electrically connected through at least one touch electrode wire, the at least one touch electrode wire is electrically connected to a touch driver such that each common electrode strip is capable of receiving a signal transmitted by the touch driver, and the touch driver provides common voltage or a touch drive signal to the touch electrode.

3. The array substrate according to claim 2, wherein in one of the touch electrodes, the common electrode strip is electrically connected through one touch electrode wire, and the one touch electrode wire is respectively electrically connected to the common electrodes adjacent to the touch electrode wire in the common electrode strip through a via.

4. The array substrate according to claim 2, wherein in one of the touch electrodes, the common electrode strip is electrically connected through two touch electrode wires, one touch electrode wire is electrically connected to the common electrodes in even rows adjacent to the touch electrode wire through a via, and the other touch electrode wire is electrically connected to the common electrodes in odd rows adjacent to the touch electrode wire through a via.

5. The array substrate according to claim 4, wherein the two touch electrode wires are provided on two sides of a same data wire, and before the two touch electrode wires are connected to the touch driver, the two touch electrode wires are connected to form a lead wire which is connected to the touch driver.

6. The array substrate according to claim 1, wherein the touch electrode wires and the data wires are made of a same metal material as the source and the drain.

7. The array substrate according to claim 5, wherein the width of the data wires is greater than the width of the touch electrode wires.

8. A display device, comprising:
    the array substrate according to claim 1; and
    a color film substrate comprising color-resistant sheets disposed in an array and black matrixes located between adjacent two color-resistant sheets.

9. The display device according to claim 8, wherein an orthographic projection of the black matrixes on the base substrate covers an orthographic projection of the data wires and the touch electrode wires on two sides of the data wires on the base substrate.

10. The display device according to claim 8, wherein an orthographic projection of the black matrixes on the base substrate covers an orthographic projection of the data wires and gaps on two sides of the data wires on the base substrate, and the gaps are located between the data wires and the touch electrode wires adjacent to the data wires.

11. The display device according to claim 8, wherein the touch driver comprises a first touch driver and a second touch driver located at two opposite ends of the array substrate, and two ends of one same touch electrode wire are respectively electrically connected to the first touch driver and the second touch driver.

* * * * *

UNITED STATES PATENT AND TRADEMARK OFFICE
CERTIFICATE OF CORRECTION

| | | |
|---|---|---|
| PATENT NO. | : 11,928,273 B2 | Page 1 of 1 |
| APPLICATION NO. | : 17/421737 | |
| DATED | : March 12, 2024 | |
| INVENTOR(S) | : Fang Hu et al. | |

It is certified that error appears in the above-identified patent and that said Letters Patent is hereby corrected as shown below:

On the Title Page

Item (71) The Applicants should be:
Applicants: Wuhan BOE Optoelectronics Technology Co., Ltd., Hubei (CN); BOE Technology Group Co., Ltd., Beijing (CN)

Signed and Sealed this
Twenty-first Day of May, 2024

Katherine Kelly Vidal
*Director of the United States Patent and Trademark Office*